(12) United States Patent
Chiu

(10) Patent No.: US 11,489,520 B2
(45) Date of Patent: Nov. 1, 2022

(54) POWER SWITCHING CIRCUIT AND POWER SWITCHING METHOD

(71) Applicant: Realtek Semiconductor Corporation, Hsinchu (TW)

(72) Inventor: Chien-Hao Chiu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/388,144

(22) Filed: Jul. 29, 2021

(65) Prior Publication Data
US 2022/0190820 A1   Jun. 16, 2022

(30) Foreign Application Priority Data

Dec. 15, 2020   (TW) .................................. 109144295

(51) Int. Cl.
| | |
|---|---|
| *H03K 17/00* | (2006.01) |
| *H03K 17/18* | (2006.01) |
| *H03K 17/16* | (2006.01) |
| *H03K 17/693* | (2006.01) |

(52) U.S. Cl.
CPC ........... *H03K 17/18* (2013.01); *H03K 17/161* (2013.01); *H03K 17/693* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 5,157,291 | A | * | 10/1992 | Shimoda .............. H03K 5/2472 327/408 |
| 2014/0264578 | A1 | * | 9/2014 | Woo .................... H03K 17/6874 257/337 |
| 2015/0028920 | A1 | * | 1/2015 | Ferrant ................ H03K 17/693 326/38 |

(Continued)

FOREIGN PATENT DOCUMENTS

| | | |
|---|---|---|
| TW | 201836238 A | 10/2018 |
| TW | 201931721 A | 8/2019 |

OTHER PUBLICATIONS

Texas Instruments, "TPS2105-EP VAUX Power-Distribution Switch," SLVSCH2, Jul. 2014.

*Primary Examiner* — Tuan T Lam
(74) *Attorney, Agent, or Firm* — Locke Lord LLP; Tim Tingkang Xia, Esq.

(57) ABSTRACT

A power switching circuit includes a first switch circuit, a second switch circuit, a control circuit, and a driver circuit. The first switch circuit receives a first power voltage and coupled to an output terminal. The first switch circuit includes a first P-type transistor and a second P-type transistor coupled in series. The second switch circuit receives a second power voltage and coupled to the output terminal. The second switch circuit includes a third P-type transistor and a fourth P-type transistor coupled in series. The control circuit generates a control signal according to an output voltage at the output terminal, a power state signal, and one of the first power voltage and the second power voltage. The driver circuit generates a first driving signal or a second driving signal according to the control signal to control the first switch circuit or the second switch circuit.

18 Claims, 3 Drawing Sheets

(56) References Cited

U.S. PATENT DOCUMENTS

| | | | |
|---|---|---|---|
| 2016/0204696 A1* | 7/2016 | Snowdon | H03K 17/145 |
| | | | 327/536 |
| 2017/0243559 A1* | 8/2017 | Xi | G09G 3/3614 |
| 2017/0271883 A1* | 9/2017 | Cai | H02J 4/00 |
| 2018/0183427 A1* | 6/2018 | Nakajima | H01L 29/7815 |
| 2019/0245574 A1* | 8/2019 | Jo | H04B 1/48 |
| 2020/0366282 A1* | 11/2020 | Morioka | H03K 17/122 |

* cited by examiner

POWER SWITCHING CIRCUIT AND POWER SWITCHING METHOD

RELATED APPLICATIONS

This application claims priority to Taiwanese Application Serial Number 109144295, filed Dec. 15, 2020, which is herein incorporated by reference.

BACKGROUND

Technical Field

The present disclosure relates to power switching technology. More particularly, the present disclosure relates to a power switching circuit and a power switching method.

Description of Related Art

With developments of technology, requirements for power saving or power consumption of electrical devices become higher and higher. In generally, a power switching circuit can be disposed between an electrical device and a power management chip to meet the requirements for power saving or power consumption. However, in some related approaches, it needs to additionally dispose a charge pump circuit in the power switching circuit and it is prone to leakage problems.

SUMMARY

Some aspects of the present disclosure are to provide a power switching circuit. The power switching circuit includes a first switch circuit, a second switch circuit, a control circuit, and a driver circuit. The first switch circuit is configured to receive a first power voltage and coupled to an output terminal. The first switch circuit includes a first P-type transistor and a second P-type transistor coupled in series. The second switch circuit is configured to receive a second power voltage and coupled to the output terminal. The second switch circuit includes a third P-type transistor and a fourth P-type transistor coupled in series. The control circuit is configured to generate a control signal according to an output voltage at the output terminal, a power state signal, and one of the first power voltage and the second power voltage. The driver circuit is configured to generate a first driving signal or a second driving signal according to the control signal to control the first switch circuit or the second switch circuit.

Some aspects of the present disclosure are to provide a power switching method. The power switching method includes following operations: receiving a first power voltage by a first switch circuit, wherein the first switch circuit includes a first P-type transistor and a second P-type transistor coupled in series; receiving a second power voltage by a second switch circuit, wherein the second switch circuit includes a third P-type transistor and a fourth P-type transistor coupled in series; generating a control signal by a control circuit according to an output voltage at an output terminal, a power state signal, and one of the first power voltage and the second power voltage; and generating a first driving signal or a second driving signal by a driver circuit according to the control signal to control the first switch circuit or the second switch circuit.

Based on the descriptions above, the power switching circuit and the power switching method of the present disclosure can be designed without additional high-voltage driver circuits (such as a charge pump circuit) or can be implemented without high-voltage processes (such as LDMOS), and can avoid leakage paths caused by VCONN-powered devices operating under different environments.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
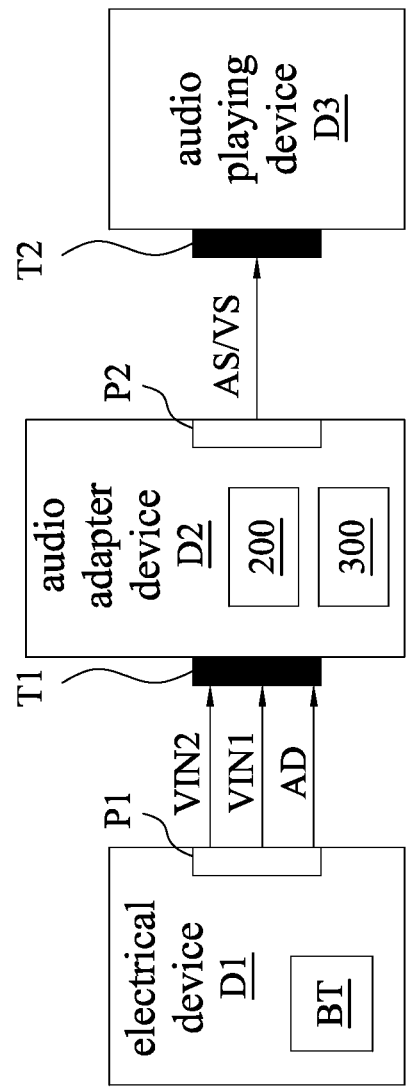
FIG. 1 is a schematic diagram illustrating an electrical system according to some embodiments of the present disclosure.

Reference is made to FIG. 1. FIG. 1 is a schematic diagram illustrating an electrical system S according to some embodiments of the present disclosure. As illustrated in FIG. 1, the electrical system S includes an electrical device D1, an audio adapter device D2, and an audio playing device D3.

In some embodiments, the electrical device D1 may be a smart phone, a notebook, a tablet compute, or other electrical apparatus that can provide audio data. The audio adapter device D2 may be a dongle. The audio playing device D3 may be earphones/headphones, a speaker, or other playing apparatus that can play audio data.

The implementations of the electrical device D1, the audio adapter device D2, and the audio playing device D3 above are merely for illustrations, and various implementations of the electrical device D1, the audio adapter device D2, and the audio playing device D3 are within the contemplated scopes of the present disclosure.

The audio adapter device D2 can be coupled between the electrical device D1 and the audio playing device D3. As illustrated in FIG. 1, the electrical device D1 includes a connection portion P1. The audio adapter device D2 includes a connection portion T1 and a connection portion P2. The audio playing device D3 includes a connection portion T2. The connection portion T1 corresponds to the connection portion P1. For example, the connection portion P1 is a female connector with the universal serial bus (USB) Type-C standard, the connection portion T1 is a male connector with the USB Type-C standard, and the connection portion T1 can be inserted into the connection portion P1. The connection portion T2 corresponds to the connection portion P2. For example, the connection portion P2 is an earphone socket, the connection portion T2 is an earphone dongle, and the connection portion T2 can be inserted into the connection portion P2.

The implementations of the connection portions T1-T2 and P1-P2 above are merely for illustration, and various implementations of the connection portions T1-T2 and P1-P2 are within the contemplated scopes of the present disclosure.

In operation, the electrical device D1 can be coupled to the audio adapter device D2 through the connection portion P1 and the connection portion T1 to provide audio data AD and power voltages VIN1-VIN2 to the audio adapter device D2. For example, a battery BT in the electrical device D1 can provide a voltage, this voltage is boosted by a boost circuit to generate the power voltage VIN1 or the power voltage VIN2, and the power voltage VIN1 or the power voltage VIN2 is transmitted to the audio adapter device D2 through the connection portion P1 and the connection portion T1. In some embodiments, the power voltage VIN2 is less than or equal to the power voltage VIN1. For example, the power voltage VIN1 may be 5 volts, and the power voltage VIN2 may be 3.6-5 volts.

The values of the power voltages VIN1-VIN2 above are merely for illustration, and various values of the power voltages VIN1-VIN2 are within the contemplated scopes of the present disclosure.

In some embodiments, the audio adapter device D2 includes a power switching circuit 200 and a function circuit 300. The power switching circuit 200 can receive the power voltages VIN1 or the power voltages VIN2 and provide an output voltage (e.g., an output voltage VOUT in FIG. 2) to the function circuit 300 according to the power voltages VIN1 or the power voltages VIN2. The function circuit 300 may be a buck converter circuit, a Codec, an analog-to-digital converter (ADC) circuit, a digital-to-analog converter (DAC) circuit, or other circuits. In addition, the audio adapter device D2 can provide a supply voltage VS to the audio playing device D3. In some embodiments, in addition to the supply voltage VS, the audio adapter device D2 can also generate an audio signal AS according to the audio data AD from the electrical device D1 and output the audio signal AS to the audio playing device D3.

In some embodiments, the audio adapter device D2 can be integrated into the audio playing device D3 to form a single electrical apparatus.

The implementations of the function circuit 300 above are merely for illustration, and various implementations of the function circuit 300 are within the contemplated scopes of the present disclosure.

Figure 2:
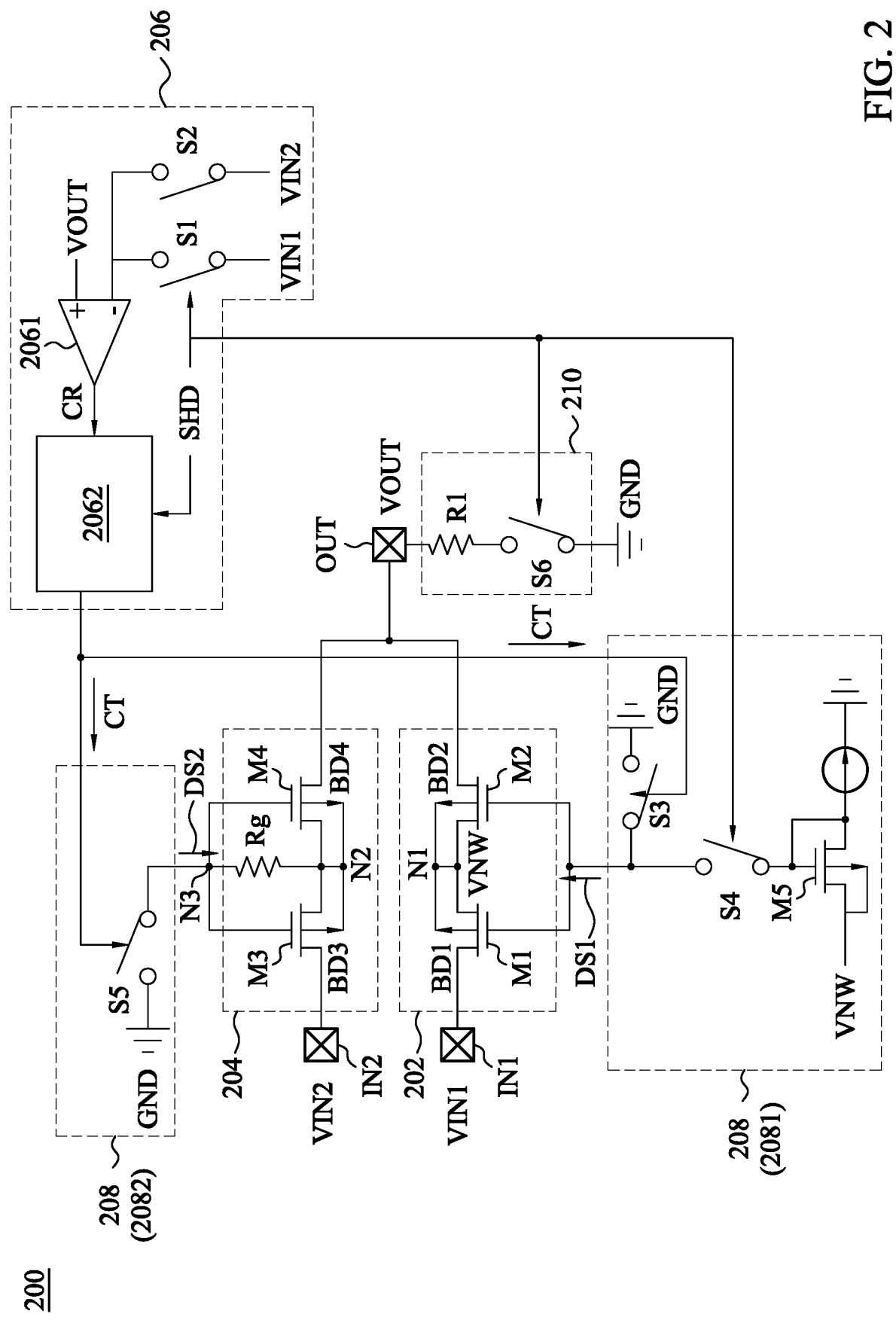
FIG. 2 is a circuit diagram illustrating a power switching circuit according to some embodiments of the present disclosure.

Reference is made to FIG. 2. FIG. 2 is a circuit diagram illustrating the power switching circuit 200 according to some embodiments of the present disclosure. As illustrated in FIG. 2, the power switching circuit 200 includes a switch circuit 202, a switch circuit 204, a control circuit 206, a driver circuit 208, and a discharging circuit 210.

The switch circuit 202 can receive the power voltage VIN1. As illustrated in FIG. 2, the switch circuit 202 includes P-type transistors M1-M2 coupled in series. The P-type transistor M1 includes a body diode BD1. The P-type transistor M2 includes a body diode BD2. A first terminal of the P-type transistor M1 is coupled to an input terminal IN1 to receive the power voltage VIN1. A first terminal of the P-type transistor M2 is coupled to an output terminal OUT. A second terminal of the P-type transistor M1, a second terminal of the P-type transistor M2, a cathode terminal of the body diode BD1, and a cathode terminal of the body diode BD2 are coupled at a node N1. The body diode BD1 and the body diode BD2 form a face-to-face structure. A voltage VNW at the node N1 is established according to the power voltage VIN1.

Similarly, the switch circuit 204 can receive the power voltage VIN2. As illustrated in FIG. 2, the switch circuit 204 includes P-type transistors M3-M4 coupled in series and a resistor Rg. The P-type transistor M3 includes a body diode BD3. The P-type transistor M4 includes a body diode BD4. A first terminal of the P-type transistor M3 is coupled to an input terminal IN2 to receive the power voltage VIN2. A first terminal of the P-type transistor M4 is coupled to the output terminal OUT. A second terminal of the P-type transistor M3, a second terminal of the P-type transistor M4, a cathode terminal of the body diode BD3, and a cathode terminal of the body diode BD4 are coupled at a node N2. The resistor Rg is coupled between the node N2 and a node N3. The body diode BD3 and the body diode BD4 also form a face-to-face structure.

The control circuit 206 can generate a control signal CT according to the output voltage VOUT, a power state signal SHD, and one of the power voltage VIN1 and the power voltage VIN2. As illustrated in FIG. 2, the control circuit 206 includes a comparator circuit 2061, a logic circuit 2062, and switches S1-S2. A first terminal of the switch S1 can receive the power voltage VIN1, a second terminal of the switch S1 is coupled to a first input terminal (e.g., a negative input terminal) of the comparator circuit 2061, and a control terminal of the switch S1 can receive the power state signal SHD (e.g., SHD=0). A first terminal of the switch S2 can receive the power voltage VIN2, a second terminal of the switch S2 is coupled to the first input terminal (e.g., the negative input terminal) of the comparator circuit 2061, and a control terminal of the switch S2 can receive the power state signal SHD (e.g., SHD=1). In other words, the switches S1-S2 are controlled by the power state signal SHD. A second input terminal (e.g., a positive input terminal) of the comparator circuit 2061 can receive the output voltage VOUT. The comparator circuit 2061 can compare the signal at its first input terminal (the power voltage VIN1 or the power voltage VIN2) with the signal at its second input terminal (the output voltage VOUT) to generate a comparison result CR. The logic circuit 2062 is coupled to an output terminal of the comparator circuit 2061 to receive the comparison result CR. The logic circuit 2062 can further receive the power state signal SHD to generate the control signal CT according to the comparison result CR and the power state signal SHD.

The driver circuit 208 can generate driving signals DS1-DS2 according to the control signal CT to control the switch circuit 202 and the switch circuit 204 respectively. As illustrated in FIG. 2, the driver circuit 208 includes a driver 2081 and a driver 2082.

The driver 2081 includes switches S3-S4 and a transistor M5. The driver 2081 is coupled between the control circuit 206 and the switch circuit 202. To be more specific, the driver 2081 is coupled to the logic circuit 2062, a control terminal of the P-type transistor M1, and a control terminal of the P-type transistor M2. The driver 2081 can receive the control signal CT from the logic circuit 2062 and generate the driving signal DS1 according to the control signal CT to control the P-type transistor M1 and the P-type transistor M2.

The driver 2082 includes a switch S5. The driver 2082 is coupled to the control circuit 206 and the switch circuit 204. To be more specific, the driver 2082 is coupled to the logic circuit 2062, and is coupled to the resistor Rg, a control terminal of the P-type transistor M3, and a control terminal of the P-type transistor M4 at the node N3. The driver 2082 can receive the control signal CT from the logic circuit 2062 and generate the driving signal DS2 according to the control signal CT to control the P-type transistor M3 and the P-type transistor M4.

The discharging circuit 210 can make the output voltage VOUT be discharged. As illustrated in FIG. 2, the discharging circuit 210 includes a resistor R1 and a switch S6. The resistor R1 and the switch S6 are coupled in series between the output terminal OUT and a ground terminal GND.

In operation, whatever the electrical device D1 provides the power voltage VIN1 to the power switching circuit 200 in the audio adapter device D2 first or not, the voltage VNW is initially established through the body diode BD1. At this time, since the power voltage VIN1 can be detected, the power state signal SHD has a first logic value (e.g., a logic value of 0). Based on the power state signal SHD having the logic value of 0, the switch S1 is turned on and the switch S2 is turned off. The comparator circuit 2061 compares the power voltage VIN1 with the output voltage VOUT. Since the power voltage VIN1 is just supplied, the output voltage VOUT is less than the power voltage VIN1 and a difference value between the output voltage VOUT and the power voltage VIN1 is greater. The comparison result CR outputted by the comparator circuit 2061 (e.g., an operational amplifier) can reflect the difference value between the output voltage VOUT and the power voltage VIN1. The logic circuit 2062 outputs the control signal CT according to the comparison result CR and the power state signal SHD. The driver 2081 outputs the driving signal DS1 according to the control signal CT acquired under a condition that the difference value between the output voltage VOUT and the power voltage VIN1 is greater (e.g., greater than a first threshold value). For example, based on the control signal CT and the power state signal SHD, the switch S3 is turned off and the switch S4 is turned on. Since the switch S4 is turned on, a control terminal of the switch M5 generates the driving signal DS1 to control the turned-on degrees of the P-type transistors M1-M2 to be smaller (e.g., a first state), in order to reduce an inrush charging current. Thus, the power voltage VIN1 can be used to charge the output terminal OUT by a current-limiting way through the P-type transistors M1-M2 with smaller turned-on degrees.

After a period of time, the output voltage VOUT at the output terminal OUT is charged to a higher level such that the difference value between the output voltage VOUT and the power voltage VIN1 is less. The driver 2081 outputs the driving signal DS1 according to the control signal CT acquired under a condition that difference value between the output voltage VOUT and the power voltage VIN1 is less (e.g., equal to or less than the aforementioned first threshold value). For example, based on the control signal CT, the switch S3 is turned on. At this time, the driver 2081 can output the driving signal DS1 according to a level of the ground terminal GND to control the turned-on degrees of the P-type transistors M1-M2 to be larger (e.g., a second state) (the turned-on degree of the second state is larger than the turned-on degree of the first state). Thus, the power voltage VIN1 can be used to charge the output terminal OUT through the P-type transistors M1-M2 with larger turned-on degrees (not current-limiting state). Since the difference value between the output voltage VOUT and the power voltage VIN1 is less, the charging current from the P-type transistors M1-M2 with larger turned-on degrees (not current-limiting way) to the output terminal OUT is smaller. In addition, when the turned-on degrees of the P-type transistors M1-M2 are larger, it can have a smaller turned-on resistor (Ron).

The descriptions above are about operations at a first stage (a soft start process) of the output voltage VOUT.

Then, the power voltage VIN2 can be detected by the system, the power state signal SHD changes to have a second logic value (e.g., a logic value of 1). The switch S6 can be turned on according to the power state signal SHD having the second logic value such that the output terminal OUT is discharged to the ground terminal GND thorough the resistor R1 and the switch S6. In addition, based on the power state signal SHD having the second logic value, the switch S1 is turned off and the switch S2 is turned on. The comparator circuit 2061 compares the power voltage VIN2 with the output voltage VOUT. Since the previous output terminal OUT is charged according to the power voltage VIN1 with a higher voltage and the output terminal OUT is just discharged, a difference value between the output voltage VOUT and the power voltage VIN2 is greater. The comparison result CR outputted by the comparator circuit 2061 (e.g., an operational amplifier) can reflect the difference value between the output voltage VOUT and the power voltage VIN2. The logic circuit 2062 outputs the control signal CT according to the comparison result CR and the power state signal SHD. The driver 2082 outputs the driving signal DS2 according to the control signal CT acquired under a condition that the difference value between the output voltage VOUT and the power voltage VIN2 is greater (e.g., greater than a second threshold value). For example, based on the control signal CT, the switch S5 is turned off. At this time, the driver 2082 can generate the driving signal DS2 to turn off the P-type transistors M3-M4 (e.g., a third state), in order to prevent the output voltage VOUT from causing instantaneous large current to flow back to the power voltage VIN2. At this stage, the output voltage VOUT is discharged through the switch S6 first, and the P-type transistors M3-M4 are turned on when the output voltage VOUT is discharged to close to the power voltage VIN2.

To be more specific, after a period of time, the output voltage VOUT at the output terminal OUT is discharged to close to the power voltage VIN2. In other words, the driver 2082 outputs the driving signal DS2 according to the control signal CT acquired under a condition that the difference value between the output voltage VOUT and the power voltage VIN2 is less (e.g., less than the second threshold value). For example, based on the control signal CT, the switch S5 is turned on. At this time, the driver 2082 can output the driving signal DS2 according to the level of the ground terminal GND to turn on the P-type transistors M3-M4 (e.g., a fourth state)(the turned-on degree of the fourth state is larger than the turned-on degree of the third state). The power voltage VIN2 can supply power to the output terminal OUT through the P-type transistors M3-M4 with larger turned-on degrees (not current-limiting state). Since the difference value between the output voltage VOUT and the power voltage VIN2 is less, the (instantaneous) excessive charging current can be avoid even if the turned-on degrees of the P-type transistors M3-M4 are larger. In addition, when the turned-on degrees of the P-type transistors M3-M4 are larger, it can have a smaller turned-on resistor (Ron).

The descriptions above are about operations at a second stage (a power saving mode) of the output voltage VOUT. Since the power voltage VIN2 is almost not greater than the power voltage VIN1 which is supplied from boost converter, so the power voltage VIN2 supplies power at the final stage (the second stage) in some embodiments in order to save power and reduce power consumption.

In some related approaches, the power switching circuits use N-type transistors as switch circuits. In these related approaches, since the N-type transistors are turned on by high voltages, it requires a high-voltage driver circuit (such as a charge pump circuit) and needs to adopt high-voltage processes. The high-voltage process is, for example, lateral double-diffused metal oxide semiconductor (LDMOS) process. In addition, these related approaches are prone to leakage problems. Furthermore, in some other related approaches, it requires additional enable signals and needs to disposed circuits related to the enable signals.

Compared to the aforementioned related approaches, the power switching circuit 200 of the present disclosure uses the P-type transistors as the switch circuits 202 and 204. Since P-type transistors are turned on by low voltages, the present disclosure can be designed without the additional high-voltage driver circuit (such as the charge pump circuit) or can be implemented without the high-voltage processes, and the present disclosure can avoid leakage paths caused by USB Type-C VCONN-powered devices (VPD) operating under different environments. In addition, since the body diode BD1 and the body diode BD2 form the face-to-face structure and the driving signal DS1 can be used to control the turned-on degrees of the P-type transistors M1-M2, it can avoid the leakage between the output terminal OUT and the power voltage VIN1. Similarly, since the body diode BD3 and the body diode BD4 form the face-to-face structure and the driving signal DS2 can be used to control the turned-on degrees of the P-type transistors M3-M4, it can avoid the leakage between the output terminal OUT and the power voltage VIN2. Furthermore, the power switching circuit 200 of the present disclosure is controlled without an additional enable signal, so the power switching circuit 200 of the present disclosure can be implemented without circuits related to the extra enable signal. Thus, it can reduce the circuit area, power consumption, and cost.

As described above, in order to save power and reduce power consumption, the power voltage VIN2 is supplied at the final stage (the second stage). Based on different applications, the power voltage VIN1 at the final stage may supply power normally (provide voltage with 5 volts), be in a floating state, or be connected to the ground after the power voltage VIN2 is detected and supplied to the output terminal OUT. However, since the body diode BD1 and the body diode BD2 form the face-to-face structure and the driving signal DS1 can be used to control the turned-on degrees of the P-type transistors M1-M2, no matter what the state of the power voltage VIN1 is at the final stage, the leakage between the output terminal OUT and the power voltage VIN1 can be avoided such that the circuits operate normally.

In addition, compared to the aforementioned related approaches, the power switching circuit 200 of the present disclosure has lower static power consumption (e.g., less than 5 microamperes) and it can save power.

In some other embodiments, if the power voltage VIN2 is supplied to the power switching circuit 200 at a time point earlier than the aforementioned first stage, the voltage at the node N3 can be pulled up rapidly through the P-type transistor M3 and the resistor Rg, so that the P-type transistors M3-M4 are turned off. The resistance value of the resistor Rg can be designed according to the response time (e.g., time constant). In some embodiments, the resistor Rg can avoid excessive currents from the driver 2082 to the ground terminal GND when the P-type transistors M3-M4 are fully turned on. In addition, since the body diode BD3 and the body diode BD4 form the face-to-face structure and the driving signal DS2 can be used to control the turned-on degrees of the P-type transistors M3-M4, it can avoid a leakage between the output terminal OUT and the power voltage VIN2. In other words, the power switching circuit 200 of the present disclosure is not only suitable for the case of providing the power voltage VIN1 first but also suitable for the case of providing the power voltage VIN2 first.

Figure 3:
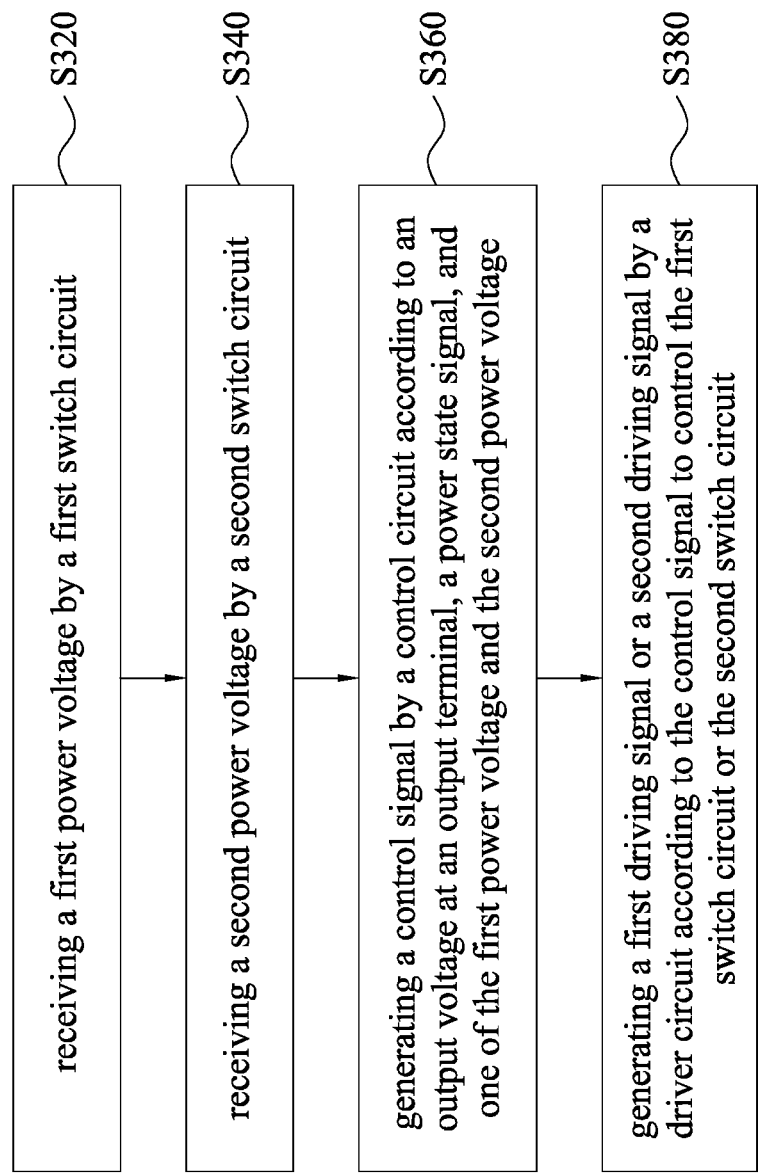
FIG. 3 is a flow diagram illustrating a power switching method according to some embodiments of the present disclosure.

Reference is made to FIG. 3. FIG. 3 is a flow diagram illustrating a power switching method 3000 according to some embodiments of the present disclosure. The power switching method 3000 includes operations S320, S340, S360, and S380.

In some embodiments, the power switching method 3000 is applied to the power switching circuit 200 in FIG. 2, but the present disclosure is not limited thereto. For better understanding, the power switching method 3000 is described with reference to the power switching circuit 200 in FIG. 2.

In operation S320, the switch circuit 202 receives the power voltage VIN1. As illustrated in FIG. 2, the switch circuit 202 includes the P-type transistors M1-M2 coupled in series, and the body diode BD1 and the body diode BD2 form the face-to-face structure.

In operation S340, the switch circuit 204 receives the power voltage VIN2. As illustrated in FIG. 2, the switch circuit 204 includes the P-type transistors M3-M4 coupled in series, and the body diode BD3 and the body diode BD4 form the face-to-face structure.

In operation S360, the control circuit 206 generates the control signal CT according to the output voltage VOUT at the out terminal OUT, the power state signal SHD, and one of the power voltages VIN1-VIN2. In some embodiments, when the power voltage VIN1 is detected, the power state signal SHD has the first logic value. When the power voltage VIN2 is detected, the power state signal SHD has the second logic value. The comparator circuit 2061 of the control circuit 206 compares one of the power voltage VIN1 and the power voltage VIN2 with the output voltage VOUT according to the power state signal SHD to generate the comparison result CR. The logic circuit 2062 of the control circuit 206 generates the control signal CT according to the comparison result CR and the power state signal SHD.

In operation S380, the driver circuit 208 generates the driving signal DS1 or the driving signal DS2 according to the control signal CT to control the switch circuit 202 or the switch circuit 204. In some embodiments, the driver 2081 of the driver circuit 208 generates the driving signal DS1 according to the control signal CT to control the P-type transistors M1-M2. The driver 2082 of the driver circuit 208 generates the driving signal DS2 according to the control signal CT to control the P-type transistors M3-M4.

Based on the descriptions above, the power switching circuit and the power switching method of the present disclosure can be designed without additional high-voltage driver circuits (such as a charge pump circuit) or can be implemented without high-voltage processes (such as LDMOS), and can avoid leakage paths caused by VCONN-powered devices operating under different environments.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power switching circuit, comprising:
a first switch circuit configured to receive a first power voltage and coupled to an output terminal, wherein the first switch circuit comprises a first P-type transistor and a second P-type transistor coupled in series;
a second switch circuit configured to receive a second power voltage and coupled to the output terminal, wherein the second switch circuit comprises a third P-type transistor and a fourth P-type transistor coupled in series;
a control circuit configured to generate a control signal according to an output voltage at the output terminal, a power state signal, and one of the first power voltage and the second power voltage; and
a driver circuit configured to generate a first driving signal or a second driving signal according to the control signal to control the first switch circuit or the second switch circuit,
wherein a body diode of the first P-type transistor, a body diode of the second P-type transistor, a terminal of the first P-type transistor, and a terminal of the second P-type transistor are coupled at a first node, and a voltage at the first node is established according to the first power voltage.

2. The power switching circuit of claim 1, wherein a body diode of the third P-type transistor, a body diode of the fourth P-type transistor, a terminal of the third P-type transistor, and a terminal of the fourth P-type transistor are coupled at a second node.

3. The power switching circuit of claim 2, further comprising:
a resistor coupled between the second node and a third node, wherein a control terminal of the third P-type transistor and a control terminal of the fourth P-type transistor are coupled at the third node.

4. The power switching circuit of claim 1, wherein the control circuit comprises:
a comparator circuit configured to compare the one of the first power voltage and the second power voltage with the output voltage to generate a comparison result; and
a logic circuit configured to generate the control signal according to the comparison result and the power state signal.

5. The power switching circuit of claim 4, wherein the driver circuit comprises:
a first driver coupled between the control circuit and the first switch circuit,
wherein when the power state signal has a first logic value and the comparison result indicates that a difference value between the first power voltage and the output voltage is greater than a first threshold value, the first driver outputs the first driving signal according to the control signal to drive the first P-type transistor and the second P-type transistor to be in a first state.

6. The power switching circuit of claim 5, wherein when the power state signal has the first logic value and the comparison result indicates that the difference value between the first power voltage and the output voltage is equal to or less than the first threshold value, the first driver outputs the first driving signal according to the control signal to drive the first P-type transistor and the second P-type transistor to be in a second state,
wherein a turned-on degree corresponding to the second state is larger than a turned-on degree corresponding to the first state.

7. The power switching circuit of claim 6, further comprising:
a discharging circuit, wherein when the power state signal has a second logic value, the output terminal is discharged to a ground terminal through the discharging circuit.

8. The power switching circuit of claim 7, wherein the driver circuit further comprises:
a second driver coupled between the control circuit and the second switch circuit, wherein when the power state signal has the second logic value and the comparison result indicates that a difference value between the output voltage and the second power voltage is greater than a second threshold value, the second driver outputs the second driving signal according to the control signal to drive the third P-type transistor and the fourth P-type transistor to be in a third state.

9. The power switching circuit of claim 8, wherein when the power state signal has the second logic value and the comparison result indicates that the difference value between the output voltage and the second power voltage is equal to or less than the second threshold value, the second driver outputs the second driving signal according to the control signal to drive the third P-type transistor and the fourth P-type transistor to be in a fourth state,
wherein a turned-on degree corresponding to the fourth state is larger than a turned-on degree corresponding to the third state.

10. The power switching circuit of claim 7, wherein when the second power voltage is detected, the power state signal is changed from the first logic value to the second logic value.

11. The power switching circuit of claim 10, wherein the second power voltage is less than the first power voltage.

12. A power switching method, comprising:
receiving a first power voltage by a first switch circuit, wherein the first switch circuit comprises a first P-type transistor and a second P-type transistor coupled in series;
receiving a second power voltage by a second switch circuit, wherein the second switch circuit comprises a third P-type transistor and a fourth P-type transistor coupled in series;
generating a control signal by a control circuit according to an output voltage at an output terminal, a power state signal, and one of the first power voltage and the second power voltage; and
generating a first driving signal or a second driving signal by a driver circuit according to the control signal to control the first switch circuit or the second switch circuit,
wherein a body diode of the first P-type transistor, a body diode of the second P-type transistor, a terminal of the first P-type transistor, and a terminal of the second P-type transistor are coupled at a first node, and a voltage at the first node is established according to the first power voltage.

13. The power switching method of claim 12, wherein a body diode of the third P-type transistor, a body diode of the fourth P-type transistor, a terminal of the third P-type transistor, and a terminal of the fourth P-type transistor are coupled at a second node.

14. The power switching method of claim 12, wherein generating the control signal by the control circuit comprises:
    comparing the one of the first power voltage and the second power voltage with the output voltage by a comparator circuit to generate a comparison result; and
    generating the control signal by a logic circuit according to the comparison result and the power state signal.

15. The power switching method of claim 14, further comprising:
    outputting the first driving signal by a first driver of the driver circuit according to the control signal to drive the first P-type transistor and the second P-type transistor to be in a first state when the power state signal has a first logic value and the comparison result indicates that a difference value between the first power voltage and the output voltage is greater than a first threshold value.

16. The power switching method of claim 15, further comprising:
    outputting the first driving signal by the first driver according to the control signal to drive the first P-type transistor and the second P-type transistor to be in a second state when the power state signal has the first logic value and the comparison result indicates that the difference value between the first power voltage and the output voltage is equal to or less than the first threshold value,
    wherein a turned-on degree corresponding to the second state is larger than a turned-on degree corresponding to the first state.

17. The power switching method of claim 16, further comprising:
    outputting the second driving signal by a second driver of the driver circuit according to the control signal to drive the third P-type transistor and the fourth P-type transistor to be in a third state when the power state signal has a second logic value and the comparison result indicates that a difference value between the output voltage and the second power voltage is greater than a second threshold value.

18. The power switching method of claim 17, further comprising:
    outputting the second driving signal by the second driver according to the control signal to drive the third P-type transistor and the fourth P-type transistor to be in a fourth state when the power state signal has the second logic value and the comparison result indicates that the difference value between the output voltage and the second power voltage is equal to or less than the second threshold value,
    wherein a turned-on degree corresponding to the fourth state is larger than a turned-on degree corresponding to the third state.

* * * * *